United States Patent
Ouye et al.

(10) Patent No.: US 10,595,365 B2
(45) Date of Patent: Mar. 17, 2020

(54) CHAMBER LID HEATER RING ASSEMBLY

(75) Inventors: Alan H. Ouye, San Mateo, CA (US); Graeme Scott, Mountain View, CA (US); Keven Kaisheng Yu, Union City, CA (US); Michael N. Grimbergen, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1311 days.

(21) Appl. No.: 13/253,627

(22) Filed: Oct. 5, 2011

(65) Prior Publication Data

US 2012/0090784 A1   Apr. 19, 2012

Related U.S. Application Data

(60) Provisional application No. 61/394,521, filed on Oct. 19, 2010.

(51) Int. Cl.
*H01J 37/32* (2006.01)
*H05B 3/42* (2006.01)

(52) U.S. Cl.
CPC .......... *H05B 3/42* (2013.01); *H01J 37/32522* (2013.01); *H05B 2203/003* (2013.01)

(58) Field of Classification Search
CPC ........... H01J 37/32522; H01J 37/3211–32119; C23C 16/488; C23C 16/4411
See application file for complete search history.

(56) References Cited

U.S. PATENT DOCUMENTS

| | | | |
|---|---|---|---|
| 4,907,242 A | 3/1990 | Maitland et al. | |
| 5,710,486 A * | 1/1998 | Ye | H01J 37/32082 315/111.21 |
| 5,865,896 A * | 2/1999 | Nowak | H01J 37/32091 118/723 AN |
| 5,922,223 A * | 7/1999 | Okumura | H01J 37/32522 118/723 I |
| 6,170,428 B1 | 1/2001 | Redeker et al. | |
| 6,238,588 B1 * | 5/2001 | Collins | H01L 21/31116 204/192.32 |
| 6,302,966 B1 * | 10/2001 | Bailey, III | H01J 37/32522 118/712 |

(Continued)

FOREIGN PATENT DOCUMENTS

| | | |
|---|---|---|
| CN | 1475598 A | 2/2004 |
| CN | 101018884 A | 8/2007 |

(Continued)

OTHER PUBLICATIONS

International Search Report and Written Opinion dated Oct. 26, 2009 for International Application No. PCT/US2009/037722.

(Continued)

*Primary Examiner* — Charlee J. C. Bennett

(74) *Attorney, Agent, or Firm* — Patterson + Sheridan, LLP

(57) ABSTRACT

Embodiments of the invention generally provide a lid heater for a plasma processing chamber. In one embodiment, a lid heater assembly is provided that includes a thermally conductive base. The thermally conductive base has a planar ring shape defining an inner opening. The lid heater assembly further includes a heating element disposed on the thermally conductive base, and an insulated center core disposed across the inner opening of the thermally conductive base.

9 Claims, 6 Drawing Sheets

(56) References Cited

U.S. PATENT DOCUMENTS

| | | | |
|---|---|---|---|
| 6,308,654 B1 | 10/2001 | Schneider et al. | |
| 6,390,019 B1* | 5/2002 | Grimbergen | H01J 37/321 |
| | | | 118/712 |
| 6,447,636 B1* | 9/2002 | Qian et al. | 156/345.48 |
| 7,743,730 B2 | 6/2010 | Kholodenko et al. | |
| 8,317,968 B2 | 11/2012 | Dhindsa et al. | |
| 8,920,599 B2* | 12/2014 | Dinev et al. | 156/345.48 |
| 2002/0007795 A1 | 1/2002 | Bailey et al. | |
| 2002/0084424 A1* | 7/2002 | O'Carroll | C23C 16/481 |
| | | | 250/492.1 |
| 2002/0185228 A1* | 12/2002 | Chen | H01J 37/321 |
| | | | 156/345.48 |
| 2005/0064248 A1* | 3/2005 | O'Donnell et al. | 428/702 |
| 2005/0155555 A1 | 7/2005 | Han et al. | |
| 2007/0004208 A1 | 1/2007 | Ohkuni | |
| 2009/0097184 A1 | 4/2009 | Buchberger, Jr. et al. | |
| 2009/0236315 A1 | 9/2009 | Willwerth et al. | |
| 2010/0025384 A1* | 2/2010 | Todorow | H01J 37/32091 |
| | | | 219/121.54 |
| 2012/0190207 A1* | 7/2012 | Nishimura | H01J 37/3211 |
| | | | 438/710 |

FOREIGN PATENT DOCUMENTS

| | | |
|---|---|---|
| JP | 2004-529486 | 9/2004 |
| KR | 10-1998-0071010 | 10/1998 |
| KR | 10-2004-0042892 | 9/2004 |
| KR | 10-2005-0116230 | 12/2005 |
| KR | 10-0787848 | 12/2007 |
| KR | 10-2010-0037060 | 4/2010 |
| TW | 348269 | 12/1998 |
| TW | 363212 | 7/1999 |
| TW | 508617 B | 11/2002 |
| TW | 201004487 A | 1/2010 |
| WO | 0137316 A1 | 5/2001 |

OTHER PUBLICATIONS

The State Intellectual Property Office of the People's Republic of China; Notice on the First Office Action for No. 201180049182.6 dated Apr. 3, 2015; 17 total pages.

International Search report and written opinion dated Apr. 19, 2012 for PCT/US2011/055100.

Taiwan Office Action dated Dec. 1, 2015 for Application No. 100137543.

English Translation of related JP Office Action dared Sep. 15, 2015.

Korean Office Action (with attached English translation) for Application No. 10-2013-7011331; dated May 17, 2017; 16 total pages.

Korean Office Action (with attached English translation) for Application No. 10-2017-7022980; dated May 29, 2018; 23 total pages.

Korean Notice of Decision of Refusal (with attached English translation) for Application No. 10-2017-7022980; dated Mar. 27, 2018; 8 total pages.

Korean Office Action (with attached English translation) for Application No. 10-2017-7022980; dated Sep. 20, 2017; 12 total pages.

Korean Office Action (with attached English translation) dated Dec. 26, 2017 for Application No. 10-2013-7011331.

Korean Office Action dated Aug. 14, 2018 for Application No. 10-2018-7018413.

* cited by examiner

CHAMBER LID HEATER RING ASSEMBLY

CROSS REFERENCE TO RELATED APPLICATIONS

This application claims priority to U.S. Provisional Patent Application Ser. No. 61/394,521, filed Sep. 19, 2010, which is incorporated herein by reference.

BACKGROUND

Field

Embodiments of the present invention generally relate to semiconductor substrate processing systems. More specifically, the invention relates to a lid heater assembly for a plasma processing system.

Background

In manufacture of integrated circuits, precise control of various process parameters is required for achieving consistent results within a substrate, as well as the results that are reproducible from substrate to substrate. As the geometry limits of the structures for forming semiconductor devices are pushed against technology limits, tighter tolerances and precise process control are critical to fabrication success. However, with shrinking geometries, precise critical dimension and etch process control has become increasingly difficult.

Many semiconductor devices are processed in the presence of a plasma. If the plasma is not uniformly positioned over the substrate, processing results may also by non-uniform. Various factors may affect plasma uniformity. For example, a heater using electrical means to heat a lid of a plasma chamber during processing may contribute to plasma non-uniformity. Any grounded metallic components in the heater can reduce power transferred from RF power source to the chamber. Electrical heating circuit in the heater can act locally to affect the power transferred into the chamber. Any non-uniformity in heating can increase in deposition and yield undesired particles during processing.

FIG. 1 schematically describes a traditional plasma processing chamber 10 with a heater 13. The plasma processing chamber 10 includes a chamber body defining a processing volume 15 for processing a substrate 12 therein. One or more coils 15, 16 are disposed over a chamber lid 18 of the chamber body 11. The coils 15, 16 ignite and maintain a plasma 17 in the processing volume 15 during processing. A heater 13 including electrically heated element 14 is configured to heat the chamber lid 18 and disposed between the chamber lid 18 and the coils 15, 16. Any metal components of the heater 13 are grounded as with the chamber body 11. The grounded components reduces power transferred from the coils 15, 16 to the plasma 17. The electrically heated element 14 interferences with power transfer between the coils 15, 16 and the plasma 17 because the electrically heated element 14 is positioned in the line-of-sight of the coils 15, 16. Areas of the chamber lid 18 that are closer to the electrically heated element 14 may have a higher temperature, up to 10 degrees Celsius, than areas that are farther from the electrically heated element 14. Temperature non-uniformity of the chamber lid 18 directly affects the uniformity of the plasma 17, which may yield process non-uniformity and particle contamination.

Although conventional plasma processing chambers have proven to be robust performers at larger critical dimensions, existing techniques for controlling the plasma uniformity are one area where improvement in plasma uniformity will contribute to the successful fabrication of next generation, submicron structures, such as those having critical dimensions of about 55 nm and beyond.

The inventors have discovered that improvements to the design of heaters utilized to control the temperature of a lid of the processing chamber have a beneficial effect on plasma uniformity and ignition, and efficient coupling of RF power.

SUMMARY

Embodiments of the invention generally provide a lid heater for a plasma processing chamber. Other embodiments provide methods and apparatus for controlling the lid temperature of a plasma processing chamber. The methods and apparatus enhance positional control of plasma location within a plasma processing chamber, and improve coupling between RF power source and the plasma within the processing chamber. Embodiments of the present invention may be utilized in etch, deposition, implant, and thermal processing systems, among other applications where the control of plasma location is desirable.

In one embodiment, a lid heater assembly is provided that includes a thermally conductive base. The thermally conductive base has a planar ring shape defining an inner opening. The lid heater assembly also further includes a heating element disposed on the thermally conductive base, and an insulated center core disposed across the inner opening of the thermally conductive base.

In another embodiment, a plasma processing chamber is provided that includes a chamber body, a chamber lid enclosing a processing volume of the chamber body, a substrate support disposed in the processing volume and a coil assembly disposed above the chamber lid configured to couple RF power to gases within the processing volume through the chamber lid. The plasma processing chamber further includes a lid heater assembly coupled to the chamber lid. The lid heater assembly comprises a heated ring having an inner opening, and an insulated center core disposed across the inner opening of the heated ring. A diameter of the inner opening at least at large as the coil assembly, and the heated ring and the coil assembly are positioned so that a magnetic field of the coil assembly is substantially directed toward inside of the inner opening.

In yet another embodiment, a lid heater assembly is provided that includes a thermally conductive base, wherein the thermally conductive base has a planar ring shape defining an inner opening and a heating element disposed on the thermally conductive base. The lid heater assembly further includes a RF shield disposed over the heating element. The RF shield is a planar ring having a gap, and the gap enables the heating element to become RF hot from a RF power provided to nearby an antenna so that the resistive heating element functions as both an inductive heater and a resistive heater.

In yet another embodiment, a method for plasma processing is provided that includes heating a chamber lid by heating a thermally conductive ring coupled to the chamber lid, and preventing heat loss form the chamber lid using an insulated center core positioned inside the opening of the thermally conductive ring. The method further includes directing a processing gas to a processing volume under the chamber lid, and igniting a plasma using a coil assembly positioned above the chamber lid. A magnetic field of the coil assembly is substantially inside the thermally conductive ring.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
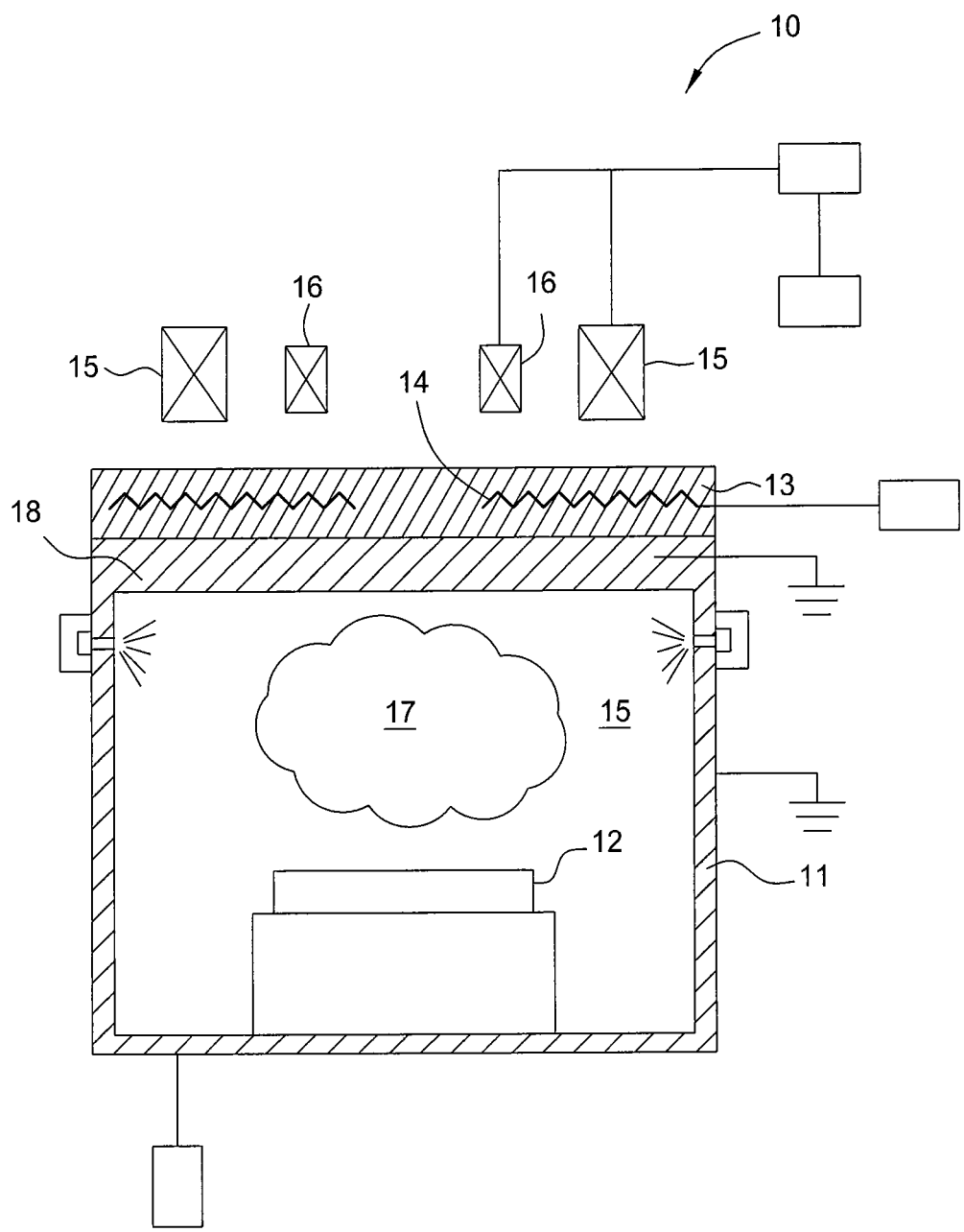
FIG. 1 is a schematic cross-sectional view of a traditional plasma processing chamber with a heater for heating the chamber lid.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Figure 2:
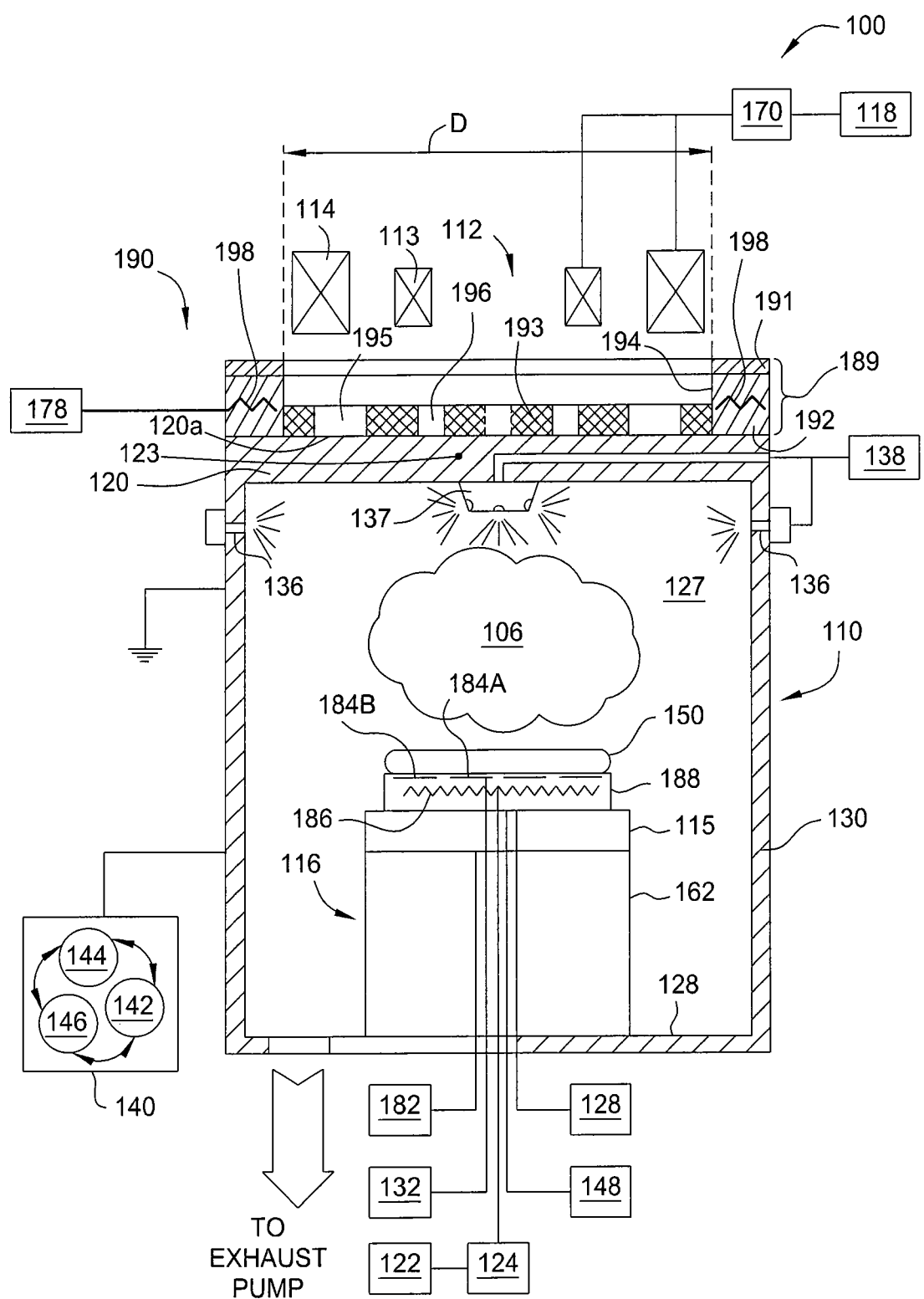
FIG. 2 is a schematic cross-sectional view of a plasma processing chamber in accordance with one embodiment of the present invention.

FIG. 2 depicts a schematic diagram of an exemplary plasma processing chamber 100 having one embodiment of a lid heater assembly 190 of the present invention. The particular embodiment of the plasma processing chamber 100 is shown in FIG. 2 as an etch reactor, but is contemplated that the lid heater assembly 190 may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiment of plasma processing chamber of FIG. 2 is provided for illustrative purposes and should not be used to limit the scope of the invention.

The plasma processing chamber 100 generally includes a chamber body 110, a gas panel 138 and a controller 140. The chamber body 110 includes a bottom 128, sidewalls 130 and a lid 120 that enclose a process volume 127. The sidewalls 130 and bottom 128 are fabricated from a conductive material, such as stainless steel or aluminum. The lid 120 may be fabricated from aluminum, stainless steel, ceramic or other suitable material.

Process gasses from the gas panel 138 are provided to the process volume 127 of the chamber body 110 through a showerhead and/or one or more nozzles. In the embodiment depicted in FIG. 2, the plasma processing chamber 100 includes a plurality of nozzles 136 positioned along the sidewalls 130 of the chamber body and a central nozzle 137 mounted below the lid 120. The central nozzle 137 may include independently controllable radial and down-facing gas outlet ports.

The controller 140 includes a central processing unit (CPU) 144, a memory 142, and support circuits 146. The controller 140 is coupled to and controls components of the plasma processing chamber 100, processes performed in the chamber body 110, as well as may facilitate an optional data exchange with databases of an integrated circuit fab.

In the depicted embodiment, the lid 120 is a substantially flat ceramic member. Other embodiments of the chamber body 110 may have other types of ceilings, e.g., a dome-shaped ceiling. Above the lid 120 is disposed an antenna 112 comprising one or more inductor coil elements. In the embodiment depicted in FIG. 2, the antenna 11 includes two co-axial coil elements 113, 114. However, other configuration and combination of coil elements may be contemplated. The antenna 112 is coupled, through a first matching network 170, to a radio-frequency (RF) plasma power source 118. During plasma processing, the antenna 112 is energized with RF power provided by the power source 118 to maintain a plasma 106 formed from the process gasses within in the process volume 127 of the chamber body 110.

In one embodiment, a substrate pedestal assembly 116 is disposed in the process volume 127. The substrate pedestal assembly 116 includes a mount assembly 162, a base assembly 115 and an electrostatic chuck 188. Alternatively, a raised squire surface may be used in place of the electrostatic chuck 188. The mounting assembly 162 couples the base assembly 115 to the bottom 128 of the chamber body 110.

The electrostatic chuck 188 is generally formed from ceramic or similar dielectric material and comprises at least one clamping electrode. In one embodiment, the electrostatic chuck 188 may comprise at least one RF electrode 186 coupled, through a second matching network 124, to a power source 122 of substrate bias. The electrostatic chuck 188 may optionally comprise one or more substrate heaters. In one embodiment, two concentric and independently controllable resistive heaters, shown as concentric heaters 184A, 184B connected to a heating power source 132, are utilized to control the edge to center temperature profile of a substrate 150.

The electrostatic chuck 188 may further comprise a plurality of gas passages (not shown), such as grooves, that are formed in the substrate supporting surface of the chuck and fluidly coupled to a source 148 of a heat transfer (or backside) gas. In operation, the backside gas (e.g., helium (He)) is provided at controlled pressure into the gas passages to enhance the heat transfer between the electrostatic chuck 188 and the substrate 150. Conventionally, at least the substrate supporting surface of the electrostatic chuck is provided with a coating resistant to the chemistries and temperatures used during processing the substrates.

The base assembly 115 is generally formed from aluminum or other metallic material. The base assembly 115 includes one or more cooling passages that are coupled to a source 182 of a heating or cooling liquid. A heat transfer fluid, which may be at least one gas such as Freon, Helium or Nitrogen, among others, or a liquid such as water or oil, among others, is provided by the source 182 through the passages to control the temperature of the base assembly 115, thereby heating or cooling the base assembly 115, thereby controlling, in part, the temperature of a substrate 150 disposed on the base assembly 115 during processing.

Temperature of the pedestal assembly 116, and hence the substrate 150, is monitored using a plurality of sensors (not shown in FIG. 2). Routing of the sensors through the pedestal assembly 116 is further described below. The temperature sensors, such as a fiber optic temperature sensor, are coupled to the controller 140 to provide a metric indicative of the temperature profile of the pedestal assembly 116.

Temperature of the lid 120 is controlled by the lid heater assembly 190. In embodiments wherein the lid 120 is fabricated from a ceramic material, the lid heater assembly 190 may be adhered or clamped to the exterior surface of the lid 120. The lid heater assembly 190 is configured to provide thermal energy by directly contact an upper surface 120a of the lid 120. In one embodiment, one or more sensors 123 may be used to monitor temperature of the lid 120 and the controller 140 may be used to adjust the lid heater assembly 190 to control the temperature of the lid 120.

Figure 3:
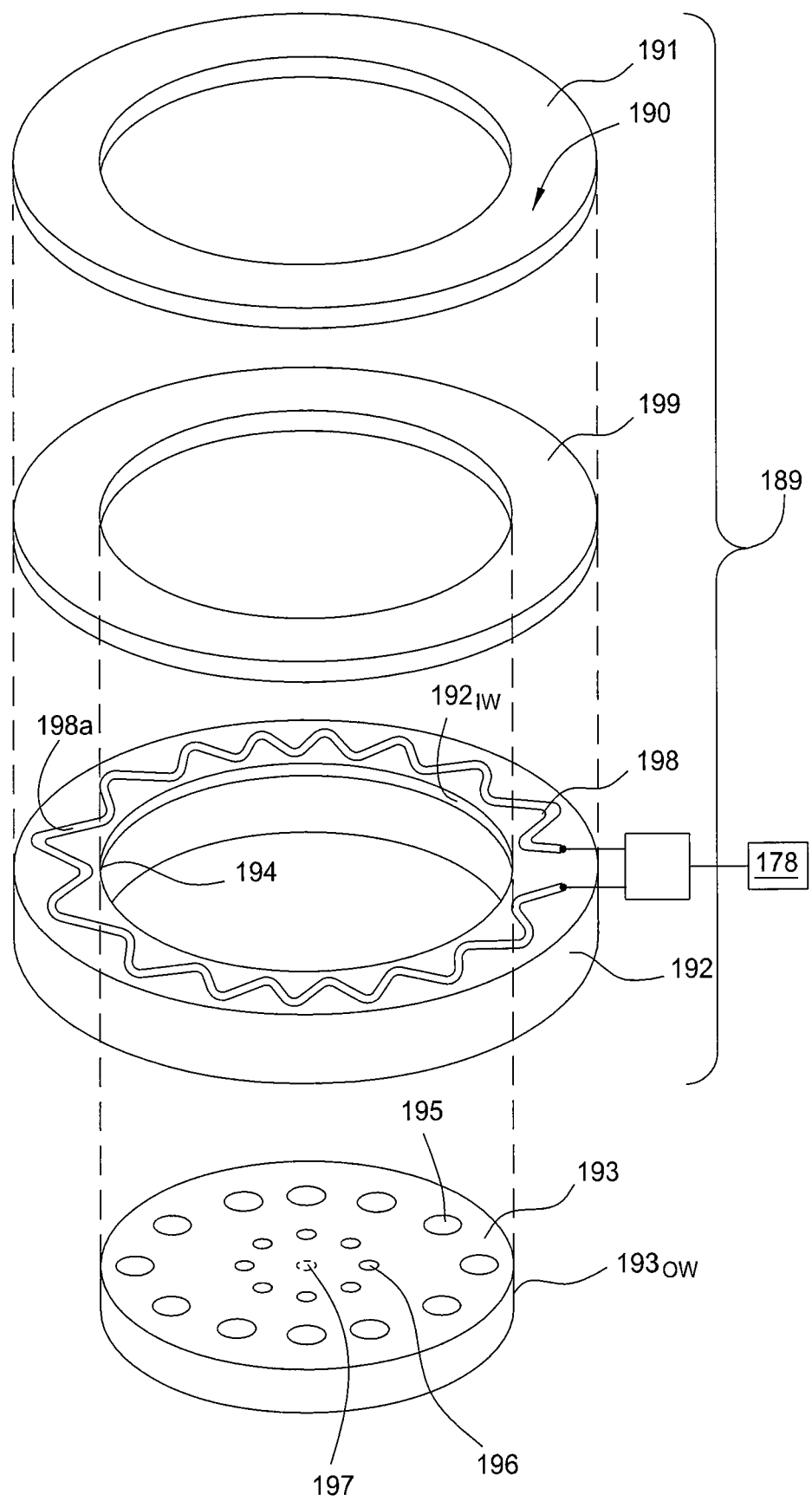
FIG. 3 is an exploded isometric view of a lid heater assembly of the plasma processing chamber of FIG. 2.
Figure 4:
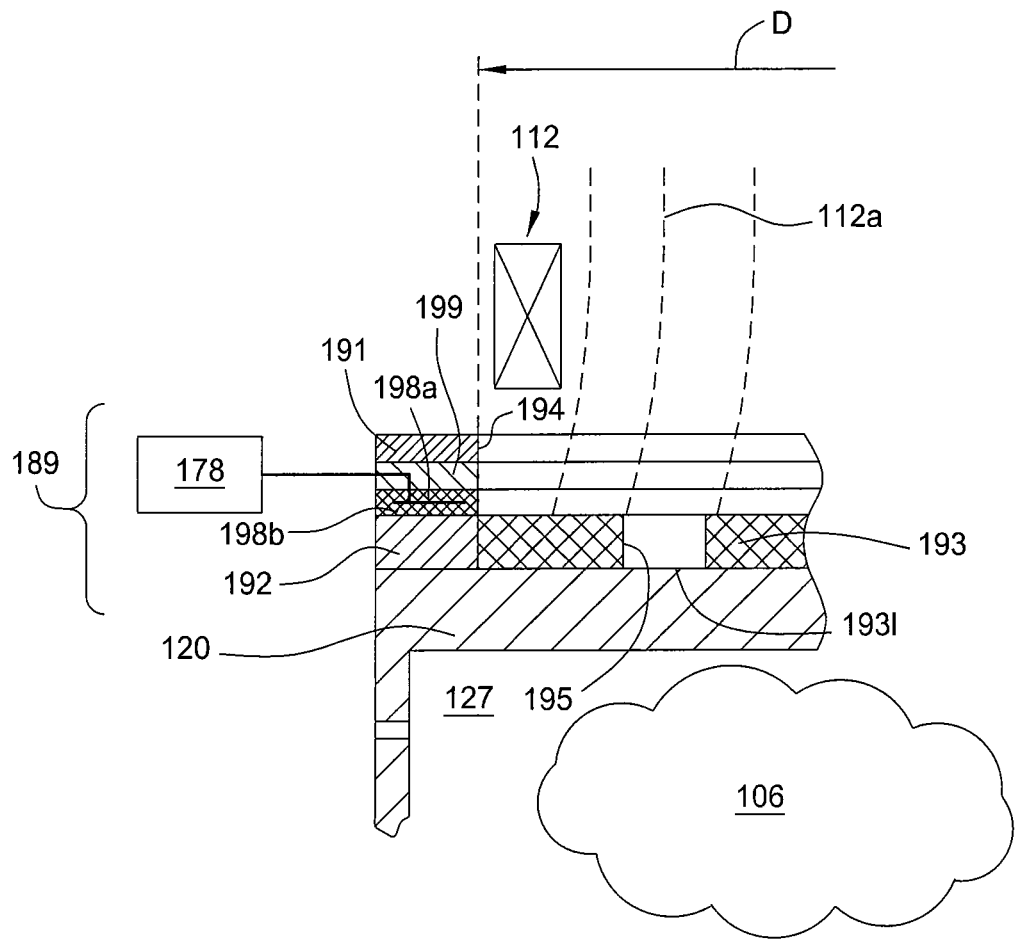
FIG. 4 is partial cross-sectional view of a plasma processing chamber in accordance with one embodiment of the present invention.

FIG. 3 is an exploded isometric view of the lid heater assembly 190 according to one embodiment of the present invention. FIG. 4 is partial cross-sectional view of the plasma processing chamber 100 showing details of the lid heater assembly 190.

The lid heater assembly 190 includes a heated ring 189 having a center opening 194, and an insulated center core 193 disposed across the center opening of the heated ring 189. The insulated center core 193 is positioned to control heat loss from the lid 120 by convention. In one embodiment, an outer sidewall $193_{OW}$ of the insulated center core 193 directly contacts an inner sidewall $192_{IW}$ of the heated ring 189. The insulated center core 193 is coupled to the lid 120 and configured to maintain a substantially uniform temperature across the lid 120 controlling the rate of heat loss in the area inside the heated ring 189. In one embodiment, the insulated center core 193 has a substantially disk shape and a lower surface 193l (shown in FIG. 4) is attached to the upper surface 120a of the lid 120.

As shown in FIG. 2, the center opening 194 of the heated ring has a diameter D large enough so that the heated ring 189 is outside the line-of-sight of the antennas 112. As a result, RF power from the antennas 112 does not need to intersect with the heated ring 189 to couple with the plasma 106.

The heated ring 189 includes a conductive base 192 having a center opening 194, an electrically heated element 198 configured to heat the conductive base 192, a thermal insulator 191 disposed over the electrically heated element 198. The conductive base 192, the electrically heated element 198 and the thermal insulator 191 are vertically stacked together. In one embodiment, the heated ring 189 also includes an RF shield 199 disposed between the thermal insulator 191 and the electrically heated element 198.

The conductive base 192 is shaped in a planar ring. The conductive base 192 provides structural and geometric shape and a uniformly heated surface to mate with the lid 120. The conductive base 192 is thermally conductive. The conductive base 192 generally has sufficient mass to provide uniform heat transfer between the electrically heated element 198 and the lid 120. The conductive base 192 may be also electrically conductive. In one embodiment, the conductive base 192 is fabricated from a metallic material having good heat transfer characteristics, such as aluminum and the like.

The electrically heated element 198 generally includes a resistive element 198a embedded in an electrical insulator 198b. The resistive element 198a is coupled to the power source 178. In one embodiment, the power source 178 is an AC power source. The power source 178 may be connected to the controller 140 to adjust the power supplied to the lid heater assembly 190.

The thermal insulator 191 is adhered to a top surface of the electrically heated element 198 or to a top surface of the RF shield 199 when the RF shield 199 is present. The thermal insulator 191 is configured to maintain a uniform temperature in the heated ring 189. The thermal insulator 191 provides protection from burns that may be received if the lid heater assembly 190 is inadvertently touched while at a high temperature. The thermal insulator 191 is generally fabricated from a material which has little influence on the RF magnetic and electrical fields, such as a high temperature elastomer, such as a silicone or other high temperature foam.

The RF shield 199 substantially prevents the resistive element 198a from influencing the orientation of the magnetic and electrical field lines generated by the antennas 112. Alternatively, the RF shield 199 may be used to enhance plasma ignition as discussed below with FIG. 6. The RF shield 199 is generally fabricated from a metallic material such as aluminum. The RF shield 199 may be aluminum foil or plate.

The insulated center core 193 is a disk-shaped body disposed inside the center opening 194 of the heated ring 189. The outer diameter of the insulated center core 193 is large enough to cover the line-of-sight of the antennas 112 during plasma generation. The insulated center core 193 is RF transparent so that the lid heater assembly 190 can provide a uniform heating of the lid 120 without interfering with coupling between the antennas 112 and the plasma 106.

Figure 5:
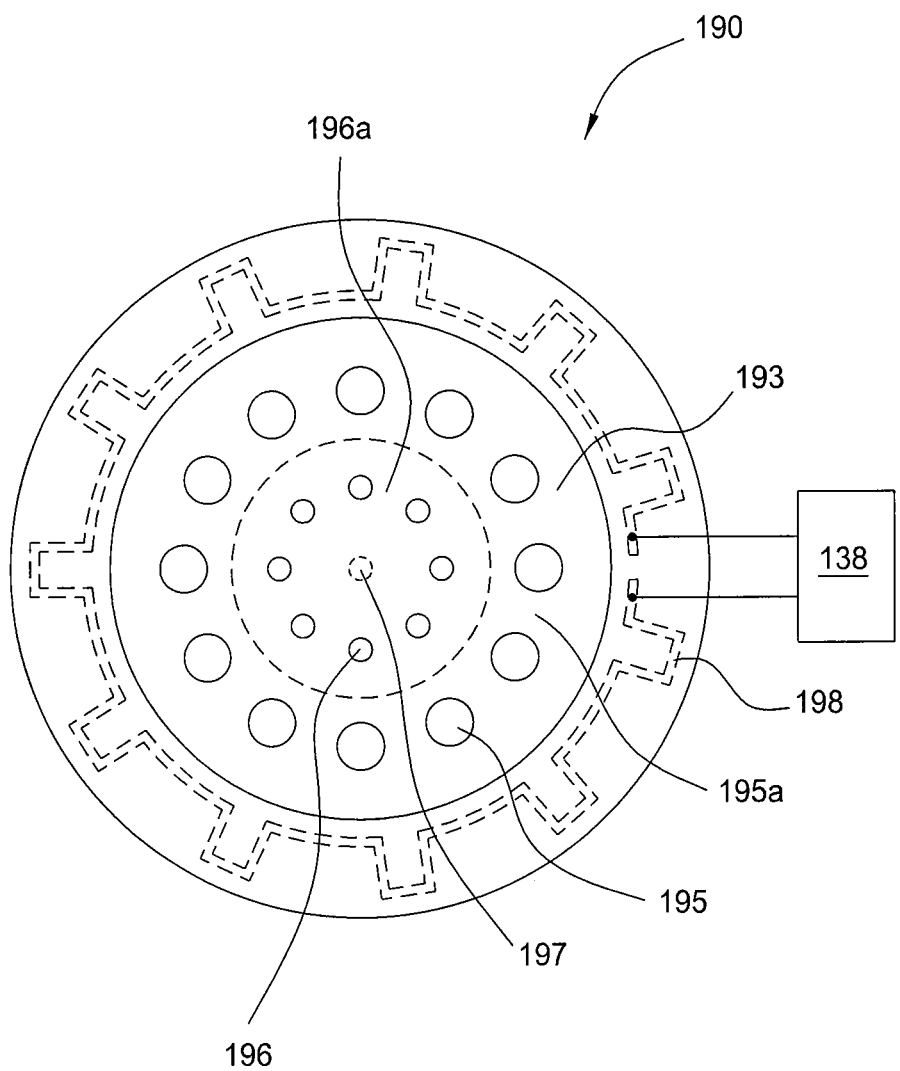
FIG. 5 is a top view of the lid heater of FIG. 3.

FIG. 5 is a top view of the lid heater assembly 190 without the thermal insulator 191 or the RF shield 199. As shown in FIG. 5, the insulated center core 193 has a plurality of outer through holes 195 formed across in an outer region 195a and a plurality of inner through holes 196 formed across an center region 196a. The outer through holes 195 and the inner through holes 196 are configured to control radiant cooling of the lid 120. The outer through holes 195 are larger in diameter than the inner through holes 196 to provide more cooling near the outer region 195a of the insulated center core 193 than near the center region 196a of the insulated center core 193. Because the outer region 195a is closer to the heated ring 189 than the center region 196a, more radiant cooling occurs through the outer through holes 196 to compensate for hotter lid temperature near the heated ring 189, thereby enabling a more uniform temperature profile in the lid 120. In one embodiment shown in FIG. 5, the outer through holes 195 are formed in a circular pattern in the outer region 195a and the inner through holes 196 are formed in a circular pattern in the center region 196a. However, other patterns of cooling holes and other shapes of cooling holes may be used to obtain uniform temperature profile in the lid 120. For example, the outer through holes 196 may be arranged to have a greater open area than the center region containing the inner through holes 196.

In one embodiment, a center hole 197 may be formed through the insulated center core 193 to allow the center nozzle 137 (shown in FIG. 2) to extend through the core 193 and connect with a gas source.

The insulated center core 193 is generally formed from materials that are RF transparent, thermal insulative, clean room applicable, chemical resistant, and flame retardant. In one embodiment, the insulated center core 193 may be formed from a high temperature elastomer, such as foamed silicone or other high temperature foam.

During operation, the heated ring 189 is heated by electrical power from the power source 178. The heated ring 189 then heats the lid 120 by conductive through the portion of the conductive base 192 that contacts the lid 120. The insulated center core 193 controls heat loss from the lid 120. The combination of thermal insulation of the insulated center core 193 and distribution of through holes 195, 196 allows a substantially uniform temperature profile to be obtained across the lid 120. In one embodiment, the sensor 123 may be used to monitor the temperature in the lid 120, and the controller 140 may be used to adjust the lid heater assembly 190 to achieve desired temperature and/or uniformity. While igniting and/or maintaining the plasma 106, magnetic field 112a of the antennas 112 goes through the insulated center core 193 and the lid 120 without being interfered by the resistive element 198a or the conductive base 192.

In another embodiment of the present invention, lid heater assembly with a ring heater and an insulated center core may be used to assist plasma maintenance and/or ignition in addition to heating.

Figure 6:
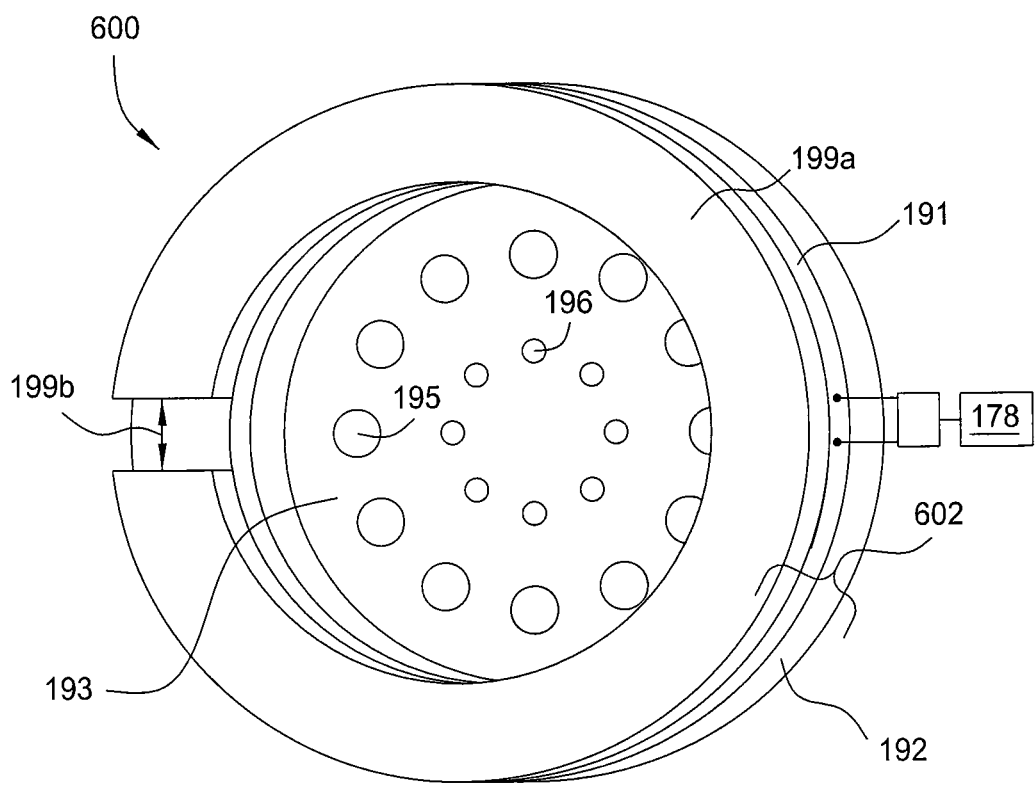
FIG. 6 is a top perspective view a heater assembly in accordance with one embodiment of the present invention.

FIG. 6 is a top perspective view a lid heater assembly 600 in accordance with one embodiment of the present invention. The lid heater assembly 600 includes a heated ring 602 and optionally an insulated center core 193. The heated ring 602 includes a conductive base 192 having a resistive heating element, a RF shield 199a, and optionally, a thermal insulator. Similar to the RF shield 199, the RF shield 199a has a ring shape for covering the electrically heated element 198. However, the RF shield 199a has a gap 199b. The gap 199b allows the conductive body 192 to become RF hot. The RF power generates an eddy current in the RF shield 199a such that the shield 199a function as an inductive heater while the conductive body 192 functions both as a resistive heater and the antenna for coupling RF power to gases within the chamber below the lid heater assembly 600. The induction heating from the RF shield 199a provides additional heating besides the resistant heating from the electrically heated element 198, thereby reducing power required to resistive heat the chamber lid.

The RF power provided to the conductive body 192 can function as a RF source for capacitively coupled plasma generation. The conductive body 192 and a RF grounded conductor in the processing chamber become two electrodes of a capacitive coupled plasma source. The function of capacitive coupled plasma is particularly beneficial for plasma processing at low power level and/or at low gas density level when plasma ignition can be difficult. For example, during fabrication of masks for photolithography, chromium etching is usually performed at low power level, such as less than 500 w, for example at about 250 W. The processing gas used in the chromium etching such as $SF_6$ is difficult to maintain and ignite into a plasma. It is even more difficult when $SF_6$ is highly diluted, for example, $SF_6$ diluted with He at about 1:30 ratio in volume. The additional capacitive coupling from the RF shield 199a makes it easier to ignite plasma at low power level or low gas density level.

The lid heater assembly 600 works well for plasma ignition with plasma processing chambers having nozzles positioned below the heated ring 602. For example, such as the processing chamber 200 illustrated in FIG. 2 wherein nozzles 136 are located to direct gas into the processing chamber. The RF shield 199a enables additional RF coupling and/or heating.

The RF shield 199a generally fabricated from a metallic material such as aluminum. The RF shield 199a may be aluminum foil or plate. In one embodiment, the RF shield 199a may be formed from an aluminum sheet having a thickness of about 0.062 inch.

Embodiments of the present invention provide several advantages over traditional external chamber lid heaters. Embodiments of the present invention reduce interference between RF power and the plasma because resistive heating element and conductive components of the lid heater are positioned outside of the line-of-sight of RF coils. Therefore, plasma uniformity has been improved. Embodiments of the present invention also reduces heat loss from convection by substantially covering the chamber lid with an insulate center core. Embodiments of the position invention also provide additional heating and coupling by using a gapped RF shield over the resistive heater, which enables use of hard to sustain gas gases such as $SF_6$ in plasma processes.

While the foregoing is directed to embodiments of the present invention, other and further embodiments of the invention may be devised without departing from the basic scope thereof, and the scope thereof is determined by the claims that follow.

What is claimed is:

1. A lid heater assembly for a plasma processing system having a coil assembly having an outer diameter, the coil assembly positioned above the lid heater assembly, comprising:
   a thermally conductive base, wherein the thermally conductive base is a planar ring defining an inner opening, wherein the inner opening has a diameter configured to circumscribe the outer diameter of the coil assembly;
   a heating element disposed on the thermally conductive base;
   an insulated center core disposed across the inner opening of the thermally conductive base;
   a thermal insulator disposed over the heating element; and
   an RF shield which is a ring without a gap and is disposed between and in contact with the heating element and the thermal insulator.

2. The lid heater assembly of claim 1, wherein the insulated center core is formed from a RF transparent material.

3. The lid heater assembly of claim 2, wherein the insulated center core has a plurality of cooling holes formed therethrough.

4. The lid heater assembly of claim 3, wherein the plurality of cooling holes comprises:
   a plurality of inner holes positioned near a center region of the insulated center core; and
   a plurality of outer holes positioned near an outer region of the insulated center core, wherein the plurality of inner holes are smaller than the plurality of outer holes.

5. The lid heater assembly of claim 3, wherein the insulated center core has more open area proximate the thermally conductive base relative to a center of the insulated center core.

6. A plasma processing system, comprising:
   a chamber body;
   a chamber lid enclosing a processing volume of the chamber body;
   a substrate support disposed in the processing volume;
   a coil assembly disposed above the chamber lid configured to couple RF power to gases within the processing volume through the chamber lid; and
   a lid heater assembly coupled to the chamber lid, wherein the lid heater assembly comprises:
      a heated ring having an inner opening, wherein a diameter of the inner opening is larger than an outer diameter of the coil assembly, and the heated ring and the coil assembly are positioned so that a magnetic field of the coil assembly is substantially directed toward an inside of the inner opening, wherein the heated ring comprises a thermally conductive base, and wherein the thermally conductive base is a planar ring defining the inner opening;
      a heating element disposed on the thermally conductive base;
      a thermal insulator disposed over the heating element;
      an RF shield which is a ring without a gap and is disposed between and in contact with the heating element and the thermal insulator; and an insulated center core disposed across the inner opening of the heated ring.

7. The plasma processing system of claim 6, wherein the insulated center core has a plurality of cooling holes formed therethrough.

8. The plasma processing system of claim 7, wherein the insulated center core has more open area proximate the thermally conductive base relative to a center of the insulated center core.

9. The plasma processing system of claim 6, wherein the insulated center core is formed from RF transparent material.

* * * * *